(12) United States Patent
Callegaro

(10) Patent No.: US 6,428,903 B1
(45) Date of Patent: Aug. 6, 2002

(54) COATINGS BASED ON HYALURONIC ACID AND THE DERIVATIVES THEREOF FOR THE PROTECTION OF ELECTRONIC PARTS FROM EXTERNAL AGENTS

(75) Inventor: Lanfranco Callegaro, Thiene Vicenza (IT)

(73) Assignee: Fidia Advanced Biopolymers S.r.L., Brindisi (IT)

(*) Notice: Subject to any disclaimer, the term of this patent is extended or adjusted under 35 U.S.C. 154(b) by 0 days.

(21) Appl. No.: 09/403,144

(22) PCT Filed: Apr. 14, 1998

(86) PCT No.: PCT/EP98/02171

§ 371 (c)(1), (2), (4) Date: Dec. 20, 1999

(87) PCT Pub. No.: WO98/46686

PCT Pub. Date: Oct. 22, 1998

(30) Foreign Application Priority Data

Apr. 14, 1997 (IT) .......................................... PD97A0074

(51) Int. Cl.$^7$ ................ B32B 9/00; C08J 7/04
(52) U.S. Cl. ............ 428/532; 428/901; 106/14.05; 427/488; 427/569; 424/78.09
(58) Field of Search ........................... 428/532, 901; 524/27; 424/78.08, 78.09, 422, 423; 106/14.05; 427/488, 569

(56) References Cited

U.S. PATENT DOCUMENTS 4,500,676 A * 2/1985 Balazs et al. ............... 525/54.2
4,851,521 A 7/1989 della Valle et al.

FOREIGN PATENT DOCUMENTS

| EP | 0138572 A2 | 4/1985 |
| EP | 0265116 A2 | 4/1988 |
| EP | 0341745 B1 | 12/1994 |
| EP | 0535200 B1 | 11/1999 |
| WO | 9203488 | 3/1992 |
| WO | 9525751 | 9/1995 |
| WO | 9624392 | 8/1996 |
| WO | 9634034 | 10/1996 |
| WO | 9635720 | 11/1996 |
| WO | 9722629 | 6/1997 |

OTHER PUBLICATIONS

Annu. Rev. Microbiol. 1995, 49:711–45, Costerton et al "Microbial Biofilms".

* cited by examiner

Primary Examiner—Vivian Chen
(74) Attorney, Agent, or Firm—Birch, Stewart, Kolasch & Birch, LLP

(57) ABSTRACT

There are disclosed electronic or microelectronic components having on at least a portion of a surface thereof a coating containing hyaluronic acid or a derivative thereof wherein said coating has the ability to inhibit adhesion of microorganisms and formation of biofilms. Also disclosed are methods of inhibiting corrosion and changes in electrical conductivity by inhibiting biofilm formation on electronic or microelectronic components by applying a coating containing hyaluronic acid or a derivative thereof directly onto the surface of said components.

11 Claims, No Drawings

COATINGS BASED ON HYALURONIC ACID AND THE DERIVATIVES THEREOF FOR THE PROTECTION OF ELECTRONIC PARTS FROM EXTERNAL AGENTS

FIELD OF THE INVENTION

The present invention provides for the use of hyaluronic acid and the derivatives thereof in forming coatings for electronic and microelectronic instruments and their parts, to inhibit adhesion of microorganisms (e.g., bacteria) to their surfaces.

BACKGROUND OF THE INVENTION

In many areas of technology, it is known that the adhesion to a surface of an instrument of microorganisms and consequent growth of the microorganisms, such as bacteria, can impair the efficacy of such instruments.

Bacterial colonization may lead to the formation of a biofilm and to the consequent deposit of mineral substances (Costerton, J. W. et al., "Microbial Biofilms", Ann. Rev. Microbiol., 49:711–745, 1995; Costerton J. W., "Overview of Microbial Biofilms" J. Indust. Microbiol. 15, 137–140, 1995).

The bacteria forming the biofilm are bound together in a sticky web of polysaccharide fibers which connect cells into strands and anchor them to a substrate and to each other. Within this microcosm, anaerobic and aerobic bacteria thrive side by side and interact to render their structure even stronger. Some release hydrogen, others reduce carbon dioxide into methane, others feed on dead cells.

The bacteria in the biofilms are, therefore, morphologically and metabolically different from the free-floating variety and the polysaccharide coating they produce seems to act as a coat of armor making it more difficult for them to be attacked by antimicrobial agents than those which are not organized into a similar structure.

Moreover, it seems that any bacterium that manages to find a surface to stick to is able to form a biofilm, activating specific genes for the production of polysaccharides and other substances necessary for the organization of a colony.

Besides leaving a deposit of mineral substances, the biofilm can cause surfaces to become corroded, for instance by altering the pH or by means of oxide reduction reactions. Indeed, anaerobic bacteria organized into biofilms are able to reduce sulfur into hydrogen sulfide, a corrosive agent that can perforate conduits, while aerobic bacteria corrode metals by oxidation. This is a problem in the field of electronics, and even more so in that of microelectronics where the increasingly tiny circuits that are being made use of are ever so more susceptible to the presence of contaminants, including microorganisms. Indeed, their presence can create short circuits between adjacent electric parts (Perera A. H.; Satterfield M. J. —Micromasking of plasma-etching due to bacteria. A yield detractor for ULSI; IEEE Transactions on semiconductor manufacturing, 1996, V9, N4 (November), P 577–580) besides corroding the surfaces.

The main problem with biofilm formation on microchips is that it acts as a conductor, thus interfering with electric signals. Electronic instruments are often wrapped, coated or closed within containers to protect them from damp, heat and corrosive agents. There are therefore various known coatings for electronic equipment, such as heat-resistant polyester, polycarbonate, nylon, polystyrene and PVC films, insulating fluorosilicone polymer for semiconductors (WO 96/34034); protective coatings made of fluorinated quinoline or ceramic (WO 92/03488).

However, such coatings only represent a mechanical barrier and are insufficient to protect the instrument from bacterial attack.

One of the natural compounds known to date to have properties which inhibit bacterial adhesion in the biomedical and health care field is hyaluronic acid, a natural polysaccharide constituted by a linear sequence of D-glucuronic acid and N-acetyl-D-glucosamine. It is present in the connective tissue, in the synovial fluid of joints, in the skin, in the umbilical cord and in the vitreous humor of the eye.

However, no one has ever thought of using to advantage hyaluronic acid or the derivatives thereof in sectors other than the biomedical one, for example in electronics or in microelectronics to coat instruments which might otherwise be prone to malfunction because of the bacterial colonies described above.

SUMMARY OF THE INVENTION

The present invention is concerned with preventing the formation of biofilms on the various surfaces and parts of electronic and microelectronic instruments, and the parts thereof, by inhibiting the adhesion of microorganisms such as bacteria to the various surfaces and parts of the electronic instruments, by coating at least a portion of a surface of such instruments or parts thereof with a coating composition containing hyaluronic acid or a derivative thereof, having the ability to inhibit bacterial adhesion.

Thus, in a first aspect, the present invention relates to an electronic or microelectronic instrument having on at least a portion of a surface thereof a coating that contains hyaluronic acid or a derivative thereof having an ability to inhibit the adhesion of microorganisms.

In a further aspect, the present invention relates to a method of providing an antimicrobial coating on at least a portion of a surface of an electronic or microelectronic instrument, or a part thereof, which method comprises:

applying to the portion of the surface of the electronic or microelectronic instrument or the part thereof, a coating that contains hyaluronic acid or a derivative thereof having the ability to inhibit the adhesion of microorganisms.

Also, the present invention relates to the use of hyaluronic acid or a derivative thereof, having the ability to inhibit the adhesion of microorganisms, to coat at least a portion of a surface of an electronic or microelectronic instrument or a part thereof.

The hyaluronic acid derivative employed according to the invention can be, e.g. and preferably, selected from the group consisting of total and partial esters of hyaluronic acid, esters of polyvalent alcohols of hyaluronic acid, inner esters of hyaluronic acid, sulfated esters of hyaluronic acid, and succinyl derivatives of hyaluronic acid.

Preferably, said portion of the surface thereof that is coated with said coating containing hyaluronic acid or the derivative thereof is resistant to adhesion by microorganisms.

By applying said hyaluronic acid or the derivatives thereof according to the invention corrosion on the portion of the surface of the electronic or microelectronic instrument or a part thereof that is coated with said hyaluronic acid or derivative thereof is preferably prevented.

It is also preferred that said coating is applied by using a plasma coating technique.

An advantage of the present invention on an industrial level, is the extreme thinness of the protective coatings provided herein compared to known coatings. For example, there is provided herein a method of applying the same coatings under contaminant-free conditions which gives even coverage of the surfaces regardless of the geometry of the surface or part of the electronic or microelectronic instrument being coated. Accordingly, a method of providing such instruments with a protective coating is also contemplated herein, as is the use of the resulting coated electronic and microelectronic instruments.

Exemplary of the coated electronic and microelectronic instruments and parts thereof, that can be provided according to the present invention, wherein a part of a surface thereof or a part thereof is coated according to the invention with a coating comprising hyaluronic acid, or a derivative thereof having the ability to inhibit the adhesion of microorganisms, are integrated microcircuits, semiconductors, connectors and terminators, memory and storage, acceleration and expansion boards, docks for boards and microchips, spacer bars for circuits, and electronic instruments intended to be inserted into the human body or in its external cavities, such as audiological aids (e.g., hearing aids), vocal aids, pace-makers and probes.

DETAILED DESCRIPTION OF THE INVENTION

The present invention provides for the use of hyaluronic acid and the derivatives thereof in coatings to inhibit the adhesion of microorganisms to the surfaces of electronic and microelectronic instruments and their parts.

The hyaluronic acid used in the present invention may be obtained by extraction, fermentation or synthesis and preferably contains the fractions described in patent Nos. EP 0138572, EP 0535200, and WO 97/22629. The preferred hyaluronic acid derivatives are those described in patent Nos. U.S. Pat. No. 4,851,521 (e.g., hyaluronic acid esters), EP 0265116 B1 (e.g., esters of polyvalent alcohols), EP 0341745 B1 (e.g., crosslinked esters of hyaluronic acid), WO 95/25751 (e.g., sulfated derivatives of hyaluronic acid), and WO 96/35720 (e.g., succinyl derivatives of hyaluronic acid).

A suitable process by which the surfaces of such instruments and parts can be coated is described in international patent application No. WO 96/24392.

In patent application No. WO 96/24392 a "plasma coating" process is provided for the coating of objects used in the fields of health care, surgery and diagnostics with a thin layer of polymers including hyaluronic acid and the derivatives thereof, firmly bound to the substrate to enhance biocompatibility and the smoothness of the coated surfaces and to inhibit adhesion by the cells or bacteria present in the biological fluids.

The ability of hyaluronic acid and its derivatives to inhibit adhesion by cells is demonstrated in the examples given in international patent No. WO 96/24392, which describes microscopic observation of the surfaces of coated biomedical objects which have been kept in contact with cell suspensions in given conditions for suitable lengths of time.

The following examples are provided to aid those desiring to practice the instant invention, with examples 1–3 describing certain coating techniques used on some microelectronic instruments, and example 4 providing an example of the problem of microbial adhesion to microelectronic parts. These provided examples are not, however, to be construed to be limiting to the instant invention, as those skilled in the art realize that there are various changes can be made in the embodiments of the following examples without departing from the spirit or scope of the instant discovery.

EXAMPLE 1

Coating of a Connection Board with Hyaluronic Acid Sodium Salt

A compatible connection board with standard bus microprocessors, presenting special channels and terminal areas in copper with a width of 2.5 mm, is treated with plasma inside a parallel plate reactor. Oxygen is introduced into the chamber at a flow rate of 20 $cm^3$ and exposed to a load from a 50 W radio frequency generator. This treatment is performed under reduced pressure of 100 mtorr for 90 seconds.

The board is then immersed completely, at room temperature, in a bath constituted by an aqueous solution of 0.6% (w/v) polyethyleneimine (Fluka). After 90 minutes, the electronic device is removed from the solution and washed thoroughly with distilled water with a conductibility of less than 0.5 microseconds.

The second step of the treatment consists in coating the superficially activated device with hyaluronic acid sodium salt. 0.5 lt. of an aqueous solution constituted by 5 gr. of hyaluronic acid with a mean molecular weight of 200,000 Da, 1.26 gr. of N-hydroxysuccinimide (Aldrich) and 2.45 gr. of 1-ethyl-3-3-dimethylaminopropyl)carbodiimide (EDC) (Fluka) is filtered through a sterile 0.22 micrometer filter.

The board is immersed in the bath and left to react at room temperature and away from the light for 24 hours.

The device is washed with at least 3 liters of distilled water filtered through a 0.22 micrometer sterile filter and then blown dry under a hood with a laminar, horizontal jet of air. Lastly, once its surface has been thus modified, the board is further dried for 36 hours at 35° C. in an oven ventilated with filtered air.

EXAMPLE 2

Coating of Coaxial SMB Connectors for a Molded Circuit, with Hyaluronic Acid 25% Esterified with Benzyl Alcohol (HYAFF® 11p25)

A series of two subminiature 50Ω connectors, with direct and 90° connection and contacts in gold-plated brass and copper, are treated with plasma in a parallel plate reactor. Nitrogen is introduced into the chamber at a flow rate of 20 $cm^3$ and exposed to a load from a generator with a radio frequency of 100 W. The treatment continues under reduced pressure at 100 mtorr for 120 seconds.

The miniconnectors thus treated are then completely immersed at room temperature in a bath constituted by a 0.6% (w/v) aqueous solution of polyethyleneimine (Fluka). Ninety minutes later the electronic devices are removed from the solution and washed thoroughly with distilled water with a conductibility of less than 1 microsecond.

The second step of the treatment consists in coating the materials with their surfaces thus activated with the hyaluronic acid derivative. 0.05 lt. of an aqueous solution consisting of 0.5 gr. of hyaluronic acid 25% esterified with benzyl alcohol (HYAFF® 11p25), 0.12 gr. of N-hydroxysuccinimide (Aldrich) and 0.23 gr. of 1-ethyl-3-(3-dimethylaminopropyl)carbodiimide (EDC) (Fluka) is filtered through a 0.22 micrometer sterile filter.

Once the conductors are immersed in the bath, the reaction begins and is left to proceed at room temperature, away from the light for 24 hours.

The devices are washed with at least 0.5 liters of distilled water filtered through a 0.22 micrometer sterile filter, after which they are blown dry under a hood with a laminar, horizontal air flow. Lastly, they are further dried for 36 hours at 35° C. in an oven ventilated with filtered air.

EXAMPLE 3

Coating of Static RAM Memory Boards, PCMCIA Type, with Hyaluronic Acid 50% Esterified with Benzyl Alcohol (HYAFF® 11p50)

A series of three RAM memory boards with a 68-pin, PCMCIA, bus interface are treated with plasma inside a parallel plate reactor. Nitrogen was introduced into the chamber at a flow rate of 20cm$^3$ and exposed to a load produced by a 100 W microwave generator. The treatment is performed under reduced pressure at 100 mtorr for 120 seconds.

The boards thus treated are completely immersed at room temperature in a bath consisting of a 0.6% (w/v) aqueous solution of polyethyleneimine (Fluka). Ninety minutes later the electronic devices are removed from the solution and thoroughly washed with distilled water with a conductibility of less than 1 microsecond.

The second step of the treatment consists in coating the materials, with their surfaces thus activated, with the derivative of hyaluronic acid sodium salt. 0.05 lt. of an aqueous solution consisting of 0.5 gr. of hyaluronic acid 50% esterified with benzyl alcohol (HYAFF11p50), 0.12 gr. of N-hydroxysuccinimide (Aldrich) and 0.23 gr. of 1-ethyl-3-(3-dimethylaminopropyl)carbodiimide (EDC) (Fluka). Once the boards have been immersed in the bath, the reaction begins and is left to proceed at room temperature, away from the light, for 24 hours.

Having washed the devices with at least 0.5 liters of distilled water through a 0.22 micrometer sterile filter, they are then blown dry under a hood with a horizontal jet of air. Lastly, they are further dried for 36 hours at 35° C. in an oven ventilated with filtered air.

EXAMPLE 4

Tests of Bacterial Adhesion on Samples Made of Silver, Gold and Silicon

For tests on bacterial adhesion we used Staphylococcus epidermidis, and the RP62A (ATCC 35984) strain in particular, characterized by the presence of a polysaccharide coat (glycocalyx) and its slime-producing properties. The bacterial strain is usually stored on Tryptic Soy Agar medium, while the frozen form is kept at −20° C. in Tryptic Soy Broth supplemented with 10% Dimethyl Sulfoxide. For the purposes of the test, it was inoculated in Tryptic Soy Broth and incubated overnight at 37° C. At the end of the incubation period, the purity of the culture obtained was checked by microscope, and the bacterial cells were washed in Phosphate Buffered Saline (PBS pH 7.4) and resuspended in PBS. The bacterial suspension in PBS was supplemented with 10% pure PBS. The concentration of the inoculated substance used for the test was 5×108 colony-forming units (cfu)/ml. The samples were incubated for 2 hours at 37° C. with 1.5 ml of the bacterial suspension, PBS+10% pure PBS). At the end of the incubation period, the samples were washed gently with PBS so as to eliminate any bacteria which had not adhered to the surfaces, after which it was placed in fixing solution (PBS+4% formaldehyde) to prepare it for the subsequent step of observation under a Scanning Electron Microscope (SEM) LEO 420 (LEO). To this end, the samples were dehydrated with a mixture of water dethanol at increasing concentrations of ethanol and then treated with hexamethyldisilazane (HMDS, Aldrich). The last step before microscopic observation is the coating of the surfaces of the samples with a thin layer of gold (Agar Auto Sputter Coater, Agar Scientific). Quantification of the results is performed as follows: each specimen was photographed and four images obtained with 10 k magnification. A bacterial count was performed on each field. As described earlier, each sample was set up in triplicate, so the values are expressed as means and standard deviations of the number of bacteria present per cm$^2$ on the basis of 12 values.

| Samples | Silver | Gold | Silicon |
| --- | --- | --- | --- |
| non treated | 21 × 10$^6$ CFU/cm$^2$ SD ± 3 × 10$^6$ | 21 × 10$^6$ CFU/cm$^2$ SD ± 3 × 10$^6$ | 19 × 10$^6$ CFU/cm$^2$ SD ± 2 × 10$^6$ |
| Treated | 14 × 10$^3$ CFU/cm$^2$ SD ± 1 × 10$^3$ | 14 × 10$^3$ CFU/cm$^2$ SD ± 1 × 10$^3$ | 10 × 10$^3$ CFU/cm$^2$ SD ± 1 × 10$^3$ |

The invention being thus described, it is clear that these methods can be modified in various ways. Such modifications are not to be considered as divergences from the spirit and purposes of the invention and any modification which would appear obvious to an expert in the field comes within the scope of the following claims.

Each of the publications and patent documents referred to herein are incorporated herein by reference in their entirety.

What is claimed is:

1. An electronic or microelectronic component that conducts electricity, having on at least a portion of a surface thereof a coating applied directly to a conductive surface, that comprises hyaluronic acid or a derivative thereof having an ability to inhibit the adhesion of microorganisms and inhibit the formation of biofilms while maintaining conductivity, wherein said component is selected from the group consisting of integrated microcircuits, semiconductors, connectors, terminators, memory and storage, acceleration and expansion boards, docks for boards and microchips, and spacer bars for circuits.

2. The electronic or microelectronic component according to claim 1, wherein said portion of the surface thereof is coated with said coating comprising hyaluronic acid or the derivative thereof using a plasma coating technique.

3. The electronic or microelectronic component according to claim 1 or 2, wherein said hyaluronic acid derivative is selected from the group consisting of total and partial esters of hyaluronic acid, esters of polyvalent alcohols of hyaluronic acid, inner esters of hyaluronic acid, sulfated esters of hyaluronic acid, and succinyl derivatives of hyaluronic acid.

4. The electronic or microelectronic component according to claim 1 or 2, wherein said portion of the surface thereof that is coated with said coating containing hyaluronic acid or the derivative thereof is resistant to adhesion by microorganisms.

5. A method of inhibiting corrosion and changes in electrical conductivity by inhibiting biofilm production comprising providing an antimicrobial coating applied directly to at least a portion of a conductive surface of an electronic or microelectronic component, which method comprises directly applying to the portion of said surface of the electronic or microelectronic component a coating that comprises hyaluronic acid or a derivative thereof.

6. The method according to claim 5, wherein said coating is applied to the electronic or microelectronic component using a plasma coating technique.

7. The method according to claim 5 or 6, wherein said hyaluronic acid derivative is selected from the group consisting of total and partial esters of hyaluronic acid, esters of polyvalent alcohols of hyaluronic acid, inner esters of hyaluronic acid, sulfated esters of hyaluronic acid, and succinyl derivatives of hyaluronic acid.

8. The method according to claim 7, wherein said portion of said surface thereof that is coated with said coating comprising hyaluronic acid or the derivative thereof is resistant to adhesion by microorganisms.

9. The method according to claim 8, wherein said component is selected from the group consisting of integrated microcircuits, semiconductors, connectors, terminators, memory and storage, acceleration and expansion boards, docks for boards and microchips, and spacer bars for circuits.

10. The method according to claim 5 or 6, wherein said portion of said surface thereof that is coated with said coating comprising hyaluronic acid or the derivative thereof is resistant to adhesion by microorganisms.

11. The method according to claim 10, wherein said component is selected from the group consisting of integrated microcircuits, semiconductors, connectors, terminators, memory and storage, acceleration and expansion boards, docks for boards and microchips, and spacer bars for circuits.

* * * * *